(12) United States Patent
Iwaki et al.

(10) Patent No.: US 9,825,609 B2
(45) Date of Patent: Nov. 21, 2017

(54) LATERALLY COUPLED MULTI-MODE MONOLITHIC FILTER

(71) Applicant: TAIYO YUDEN CO., LTD., Tokyo (JP)

(72) Inventors: Masafumi Iwaki, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 35 days.

(21) Appl. No.: 14/879,808

(22) Filed: Oct. 9, 2015

(65) Prior Publication Data

US 2016/0172573 A1 Jun. 16, 2016

(30) Foreign Application Priority Data

Dec. 11, 2014 (JP) .................. 2014-251091

(51) Int. Cl.
*H03H 9/02* (2006.01)
*H03H 9/64* (2006.01)
*H03H 9/56* (2006.01)

(52) U.S. Cl.
CPC ........ *H03H 9/02228* (2013.01); *H03H 9/564* (2013.01); *H03H 9/64* (2013.01); *H03H 9/02677* (2013.01)

(58) Field of Classification Search
CPC ...... H03H 9/564; H03H 9/64; H03H 9/02228; H03H 9/02677
USPC .......................... 333/133, 186–188, 193–196
See application file for complete search history.

(56) References Cited

U.S. PATENT DOCUMENTS

| 7,370,396 B2* | 5/2008 | Namba | H03H 3/04 29/25.35 |
| 2001/0048386 A1* | 12/2001 | Edmonson | G01S 13/755 342/42 |
| 2012/0218060 A1* | 8/2012 | Burak | H03H 3/04 333/191 |
| 2013/0120081 A1* | 5/2013 | Zuo | H03H 9/02228 333/187 |
| 2013/0134838 A1* | 5/2013 | Yun | H01L 41/047 310/366 |
| 2013/0321100 A1 | 12/2013 | Wang | |
| 2015/0244343 A1 | 8/2015 | Wang | |
| 2015/0270826 A1* | 9/2015 | Burak | H03H 9/547 333/187 |

FOREIGN PATENT DOCUMENTS

JP 2009-188484 A 8/2009
JP 2009-188599 A 8/2009

* cited by examiner

*Primary Examiner* — Robert Pascal
*Assistant Examiner* — Jorge Salazar, Jr.
(74) *Attorney, Agent, or Firm* — Chen Yoshimura LLP

(57) ABSTRACT

A laterally coupled multi-mode monolithic filter includes: a substrate; a piezoelectric film formed on the substrate; a ground electrode formed on a first surface of the piezoelectric film; and signal electrodes formed on a second surface of the piezoelectric film and arranged in parallel to each other, the second surface being opposite to the first surface, each of the signal electrodes including a first electrode finger and a second electrode finger, wherein the first electrode finger and the second electrode finger have different electric potentials; adjacent signal electrodes of the signal electrodes are at a distance from each other, the distance being greater than a pitch of the first electrode finger and the second electrode finger.

14 Claims, 16 Drawing Sheets

LATERALLY COUPLED MULTI-MODE MONOLITHIC FILTER

CROSS-REFERENCE TO RELATED APPLICATION

This application is based upon and claims the benefit of priority of the prior Japanese Patent Application No. 2014-251091, filed on Dec. 11, 2014, the entire contents of which are incorporated herein by reference.

FIELD

A certain aspect of the present invention relates to a laterally coupled multi-mode monolithic filter.

BACKGROUND

High frequency communication systems use a high frequency band of, for example, 2 GHz or greater to perform high speed and large-volume communications. As a filter for high frequency devices, there has been known laterally coupled multi-mode monolithic filters using a piezoelectric film having a high acoustic velocity. The laterally coupled multi-mode monolithic filter has a structure designed to have a ground electrode and a signal electrode formed across a piezoelectric film. The signal electrode includes two or more electrodes to which signals are applied as disclosed in, for example, Japanese Patent Application Publication Nos. 2009-188484 and 2009-188599.

However, the aspect ratio of the signal electrode may increase when the input and output impedance of the filter is adjusted. The increase in the aspect ratio of the signal electrode causes the concentration of stress on the piezoelectric film and may cause cracks or the like. Alternatively, acoustic waves may leak in the lateral direction of the signal electrode.

SUMMARY OF THE INVENTION

According to an aspect of the present invention, there is provided a laterally coupled multi-mode monolithic filter including: a substrate; a piezoelectric film formed on the substrate; a ground electrode formed on a first surface of the piezoelectric film; and signal electrodes formed on a second surface of the piezoelectric film and arranged in parallel to each other, the second surface being opposite to the first surface, each of the signal electrodes including a first electrode finger and a second electrode finger, wherein the first electrode finger and the second electrode finger have different electric potentials; adjacent signal electrodes of the signal electrodes are at a distance from each other, the distance being greater than a pitch of the first electrode finger and the second electrode finger.

According to another aspect of the present invention, there is provided a laterally coupled multi-mode monolithic filter including: a substrate; a piezoelectric film formed on the substrate; a ground electrode formed on a first surface of the piezoelectric film; and a signal electrode formed on a second surface of the piezoelectric film and including a first electrode finger and a second electrode finger, the second surface being opposite to the first surface, the second electrode finger having an electric potential different from an electric potential of the first electrode finger, wherein at least a part of the piezoelectric film is removed at an outside of the signal electrode in an arrangement direction of the first electrode finger and the second electrode finger.

According to another aspect of the present invention, there is provided a laterally coupled multi-mode monolithic filter including: a substrate; a piezoelectric film formed on the substrate; a ground electrode formed on a first surface of the piezoelectric film; a signal electrode formed on a second surface of the piezoelectric film and including a first electrode finger and a second electrode finger, the second surface being opposite to the first surface, the second electrode finger having an electric potential different from an electric potential of the first electrode finger; and a dielectric film formed in the piezoelectric film at an outside of the signal electrode in an arrangement direction of the first electrode finger and the second electrode finger and differing from the piezoelectric film.

According to another aspect of the present invention, there is provided a laterally coupled multi-mode monolithic filter including: a substrate; a piezoelectric film formed on the substrate; a ground electrode formed on a first surface of the piezoelectric film; a signal electrode formed on a second surface of the piezoelectric film and including a first electrode finger and a second electrode finger, the second surface being opposite to the first surface, the second electrode finger having an electric potential different from an electric potential of the first electrode finger; and a reverse-phase electrode including a third electrode finger and a fourth electrode finger at an outside of the signal electrode in an arrangement direction of the first electrode finger and the second electrode finger, the third electrode finger having an electric potential same as an electric potential of the first electrode finger, the fourth electrode having an electric potential same as an electric potential of the second electrode finger, wherein the first electrode finger and the third electrode finger adjacent to each other have the same electric potential, or the second electrode finger and the fourth electrode finger adjacent to each other have the same electric potential.

DETAILED DESCRIPTION

Figure 1A:
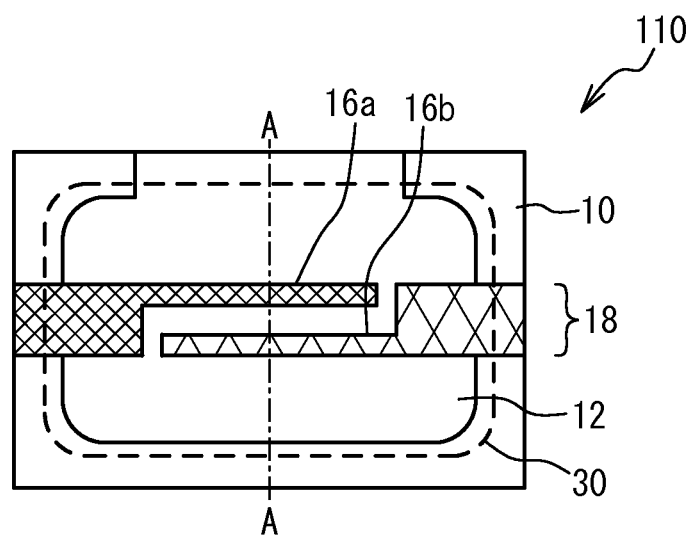
FIG. 1A is a plan view of a filter in accordance with a first comparative example.
Figure 1B:
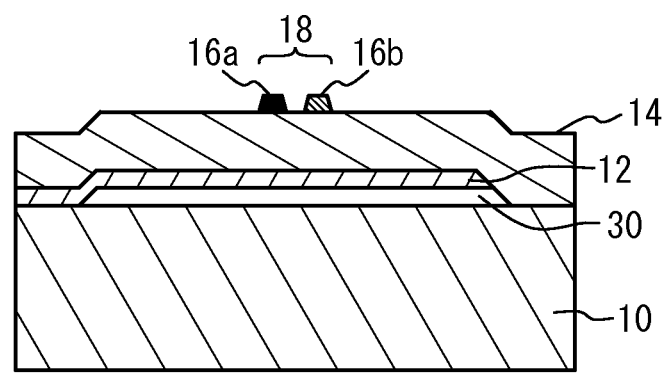
FIG. 1B is a cross-sectional view taken along line A-A in FIG. 1A.

A description will first be given of laterally coupled multi-mode monolithic filters in accordance with comparative examples. FIG. 1A is a plan view of a filter in accordance with a first comparative example, and FIG. 1B is a cross-sectional view taken along line A-A in FIG. 1A. FIG. 1A transparently illustrates a piezoelectric film 14. FIG. 1B is a cross-sectional view schematically illustrating a cross-section taken along line A-A in FIG. 1A, and FIG. 1A and FIG. 1B may slightly differ in detail. This is applicable to the drawings hereinafter. As illustrated in FIG. 1A and FIG. 1B, a filter 110 includes the piezoelectric film 14 formed on a substrate 10. A ground electrode 12 is formed on a first surface (a lower surface in FIG. 1B) of the piezoelectric film 14. A signal electrode 18 is formed on a second surface (an upper surface in FIG. 1B) of the piezoelectric film 14, the second surface being opposite to the first surface. The ground electrode 12 is supplied with a ground potential. The signal electrode 18 includes electrode fingers 16a and 16b. The electrode fingers 16a and 16b have different electric potentials. An air-space 30 is formed between the substrate 10 and the ground electrode 12.

Figure 2A:
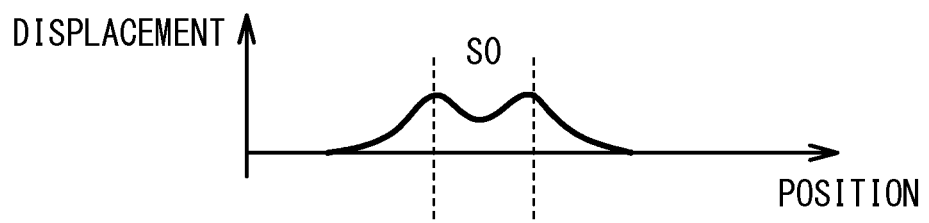
FIG. 2A and FIG. 2B are diagrams illustrating a displacement in a piezoelectric film with respect to a position.
Figure 2B:
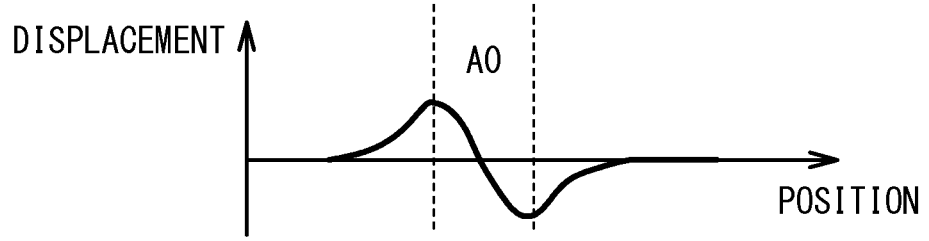
Figure 2C:
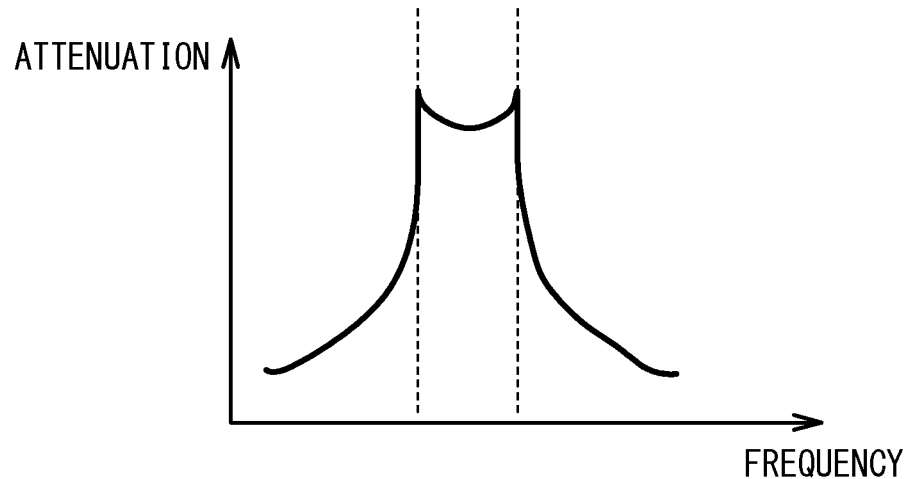
FIG. 2C is a graph of frequency versus attenuation.

FIG. 2A and FIG. 2B are diagrams illustrating a displacement in the piezoelectric film with respect to a position, and FIG. 2C is a graph of frequency versus attenuation. In FIG. 2A and FIG. 2B, the position represents a position in the A-A direction in FIG. 1A, and the displacement represents a displacement due to acoustic waves in the piezoelectric film 14. In FIG. 2C, the attenuation represents attenuation of a high-frequency signal transmitted between the electrode fingers 16a and 16b. As illustrated in FIG. 2A and FIG. 2B, the application of high-frequency signals to the electrode fingers 16a and 16b excites a symmetric mode S0, which is piezoelectrically symmetric, and an antisymmetric mode A0, which is piezoelectrically antisymmetric, in the piezoelectric film 14. As illustrated in FIG. 2C, the attenuation is small at frequencies corresponding to the symmetric mode S0 and the antisymmetric mode A0, and the attenuation is large at other frequencies in attenuation characteristics. Thus, the filter 110 acts as a bandpass filter.

Figure 3A:
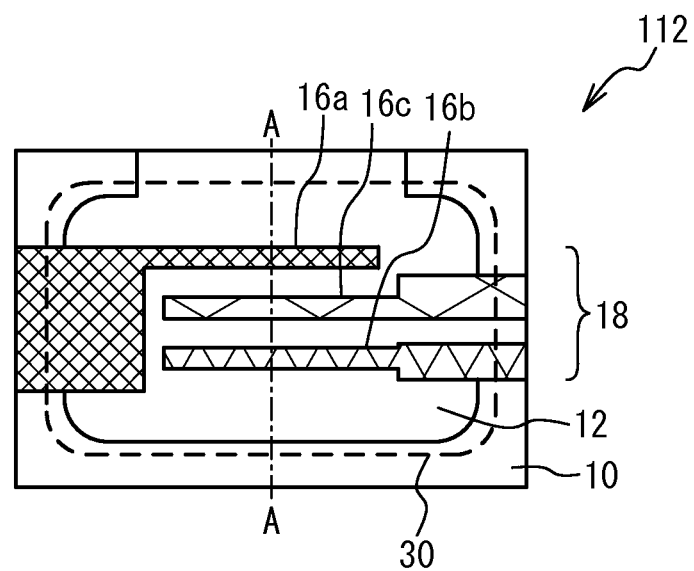
FIG. 3A is a plan view of a filter in accordance with a second comparative example.
Figure 3B:
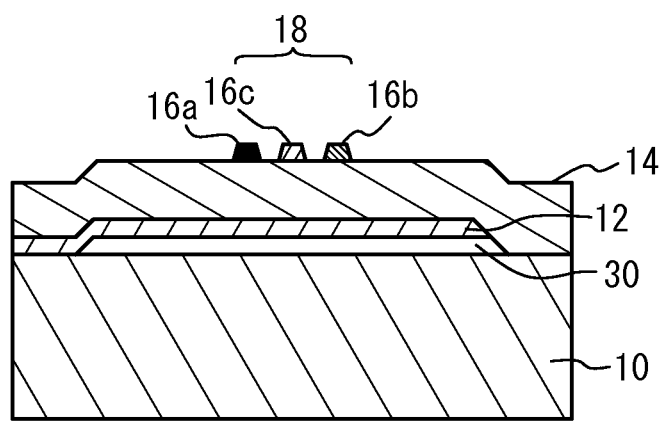
FIG. 3B is a cross-sectional view taken along line A-A in FIG. 3A.

FIG. 3A is a plan view of a filter in accordance with a second comparative example, and FIG. 3B is a cross-sectional view taken along line A-A in FIG. 3A. As illustrated in FIG. 3A and FIG. 3B, in a filter 112, the signal electrode 18 includes an electrode finger 16c having an electric potential different from those of the electrode fingers 16a and 16b. The electrode fingers 16a through 16c are located at equal intervals. Other structures are the same as those of the first comparative example, and thus the description is omitted.

Figure 4A:
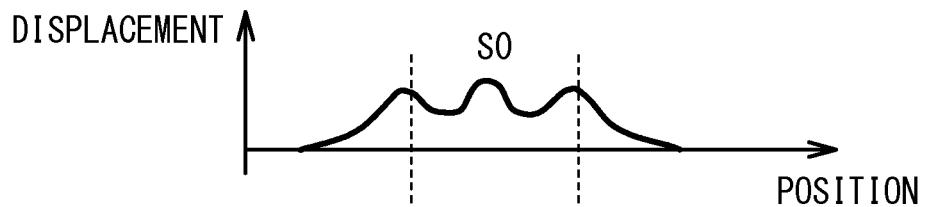
FIG. 4A through FIG. 4C are diagrams illustrating a displacement in a piezoelectric film with respect to a position.
Figure 4B:
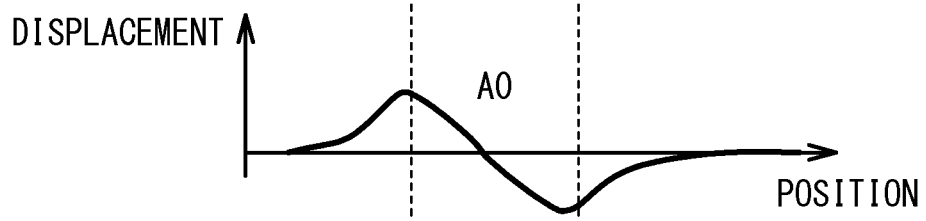
Figure 4C:
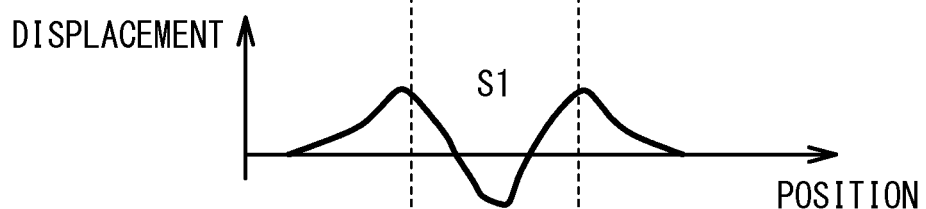
Figure 4D:
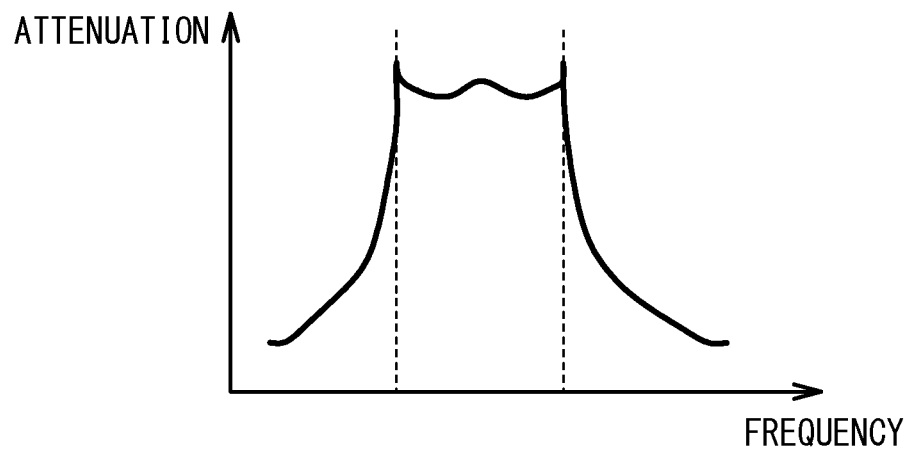
FIG. 4D is a graph of frequency versus attenuation.

FIG. 4A through FIG. 4C are diagrams illustrating a displacement in the piezoelectric film with respect to a position, and FIG. 4D is a graph of frequency versus attenuation. As illustrated in FIG. 4A through FIG. 4C, when a ground potential is supplied to the electrode finger 16c and high-frequency signals are applied to the electrode fingers 16a and 16b, two symmetric modes S0 and S1, which are piezoelectrically symmetric, and the antisymmetric mode A0, which is piezoelectrically antisymmetric, are excited in the piezoelectric film 14. As illustrated in FIG. 4D, the filter characteristics exhibit bandpass filter characteristics due to the two symmetric modes S0 and S1 and the single antisymmetric mode A0.

Figure 5A:
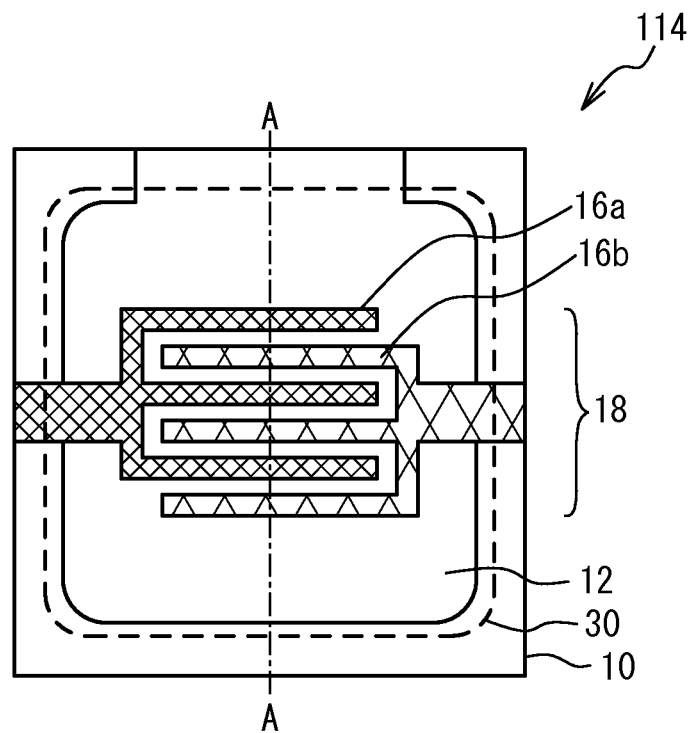
FIG. 5A is a plan view of a filter in accordance with a third comparative example.
Figure 5B:
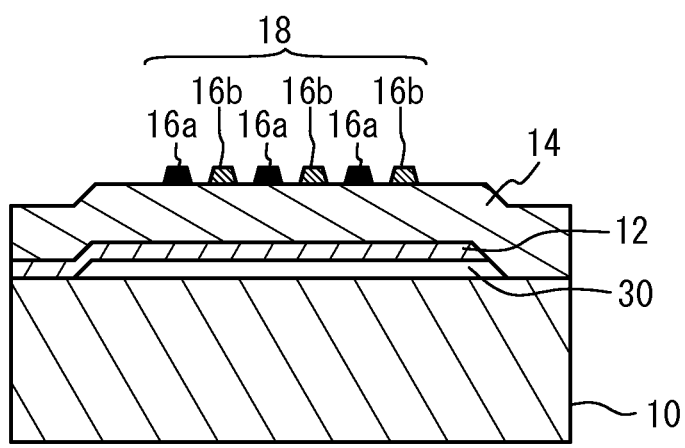
FIG. 5B is a cross-sectional view taken along line A-A in FIG. 5A.

FIG. 5A is a plan view of a filter in accordance with a third comparative example, and FIG. 5B is a cross-sectional view taken along line A-A in FIG. 5A. As illustrated in FIG. 5A and FIG. 5B, a filter 114 includes two or more electrode fingers 16a formed therein and two or more electrode fingers 16b formed therein. The electrode fingers 16a and 16b are arranged so that the adjacent electrode fingers have different electric potentials. As illustrated, the electrode fingers 16a and 16b form multiple pairs. Other structures are the same as those of the first comparative example, and thus the description is omitted.

Figure 6A:
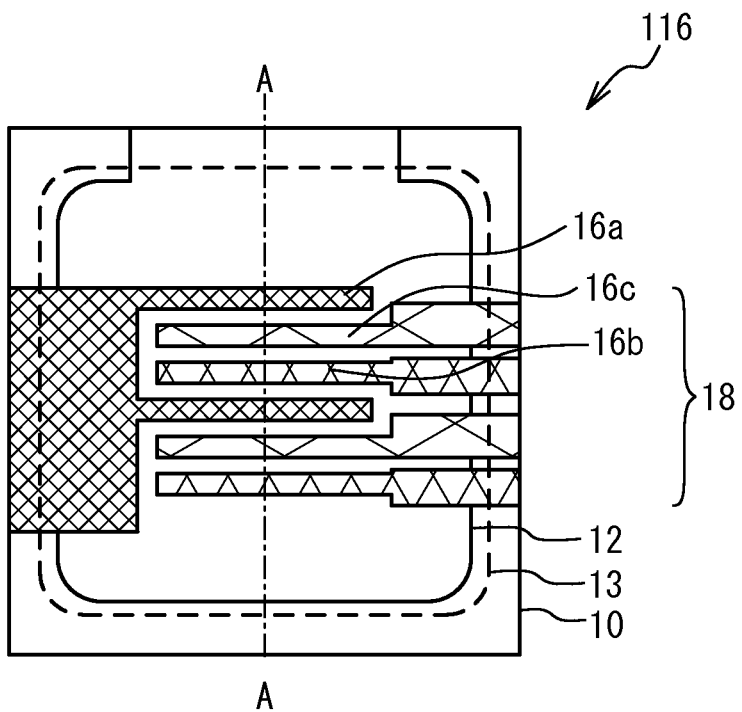
FIG. 6A is a plan view of a filter in accordance with a fourth comparative example.
Figure 6B:
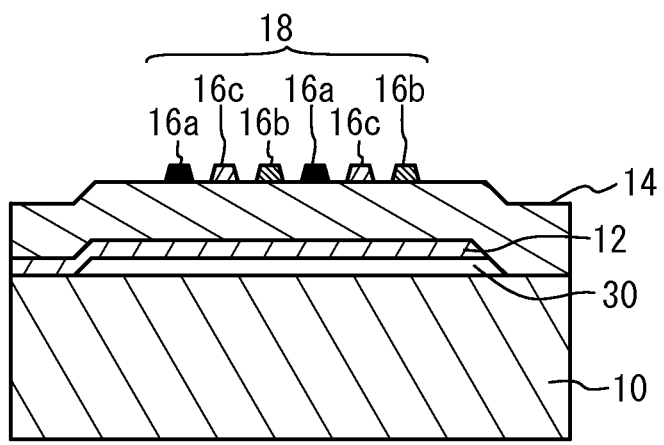
FIG. 6B is a cross-sectional view taken along line A-A in FIG. 6A.

FIG. 6A is a plan view of a filter in accordance with a fourth comparative example, and FIG. 6B is a cross-sectional view taken along line A-A in FIG. 6A. As illustrated in FIG. 6A and FIG. 6B, a filter 116 includes two or more electrode fingers 16a formed therein, two or more electrode fingers 16b formed therein, and two or more electrode fingers 16c formed therein. As illustrated, the electrode fingers 16a, 16b, and 16c form multiple groups. Other structures are the same as those of the second comparative example, and thus the description is omitted.

As described in the third and fourth comparative examples, each of the electrode fingers 16a through 16c may be plurally formed. This structure enables to make the phase variation steep compared to the first and second comparative examples.

Figure 7A:
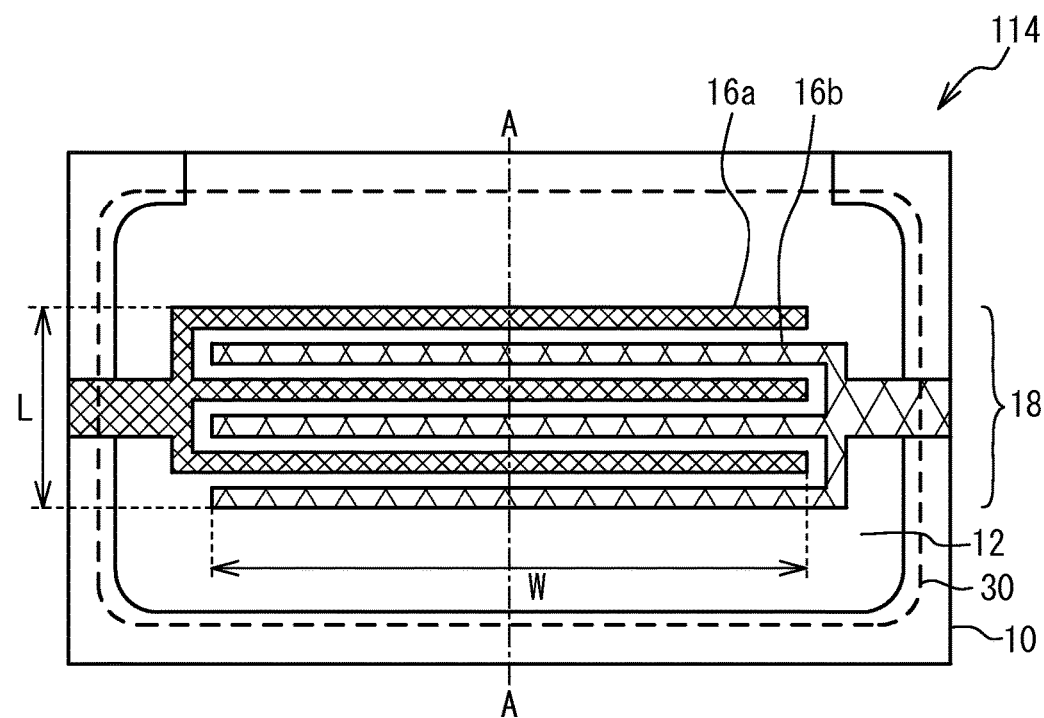
FIG. 7A is a plan view of an alternative filter in accordance with the third comparative example.
Figure 7B:
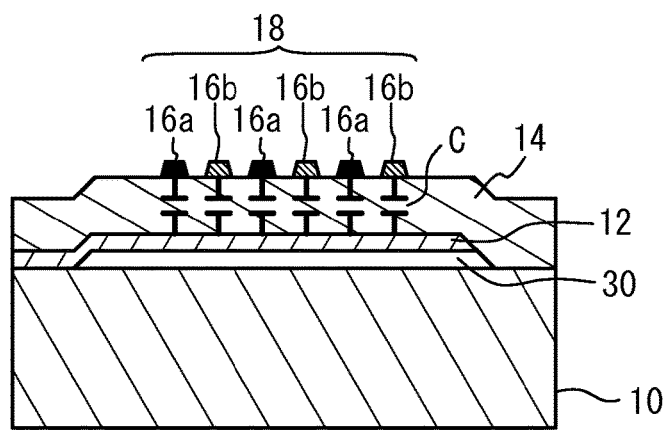
FIG. 7B is a cross-sectional view taken along line A-A in FIG. 7A.

A description will be given of a design method of input and output impedance when designing a filter with use of the third comparative example as an example. FIG. 7A is a plan view of an alternative filter in accordance with the third comparative example, and FIG. 7B is a cross-sectional view taken along line A-A in FIG. 7A. As illustrated in FIG. 7B, the input and output impedance of the signal electrode 18 of the filter 114 mostly depends on capacitance values C between the electrode fingers 16a and 16b and the ground electrode 12. Thus, as illustrated in FIG. 7A, the input and output impedance is controlled by an electrode overlap width W that is a width with which the electrode fingers 16a and 16b overlap each other. As the electrode overlap width W increases, the capacitance value C increases, and the input and output impedance decreases. As the electrode overlap width W decreases, the capacitance value C decreases, and the input and output impedance increases.

It may be considered to increase the number of pairs of the electrode fingers 16a and 16b to decrease the input and output impedance. However, when the number of pairs is changed, the filter characteristics, including pass characteristics and attenuation characteristics, greatly change. Thus, to design the input and output impedance without changing the filter characteristics, the input and output impedance is controlled by the electrode overlap width W.

However, as the electrode overlap width W increases, the aspect ratio W/L of the signal electrode 18 increases. The increase in aspect ratio causes the concentration of stress on the piezoelectric film 14, and may cause cracks in the piezoelectric film 14. For example, in a structure designed to have the electrode fingers 16a and 16b formed above the single air-space 30, the piezoelectric film 14 is easily damaged when stress concentrates on the piezoelectric film 14.

First Embodiment

Figure 8A:
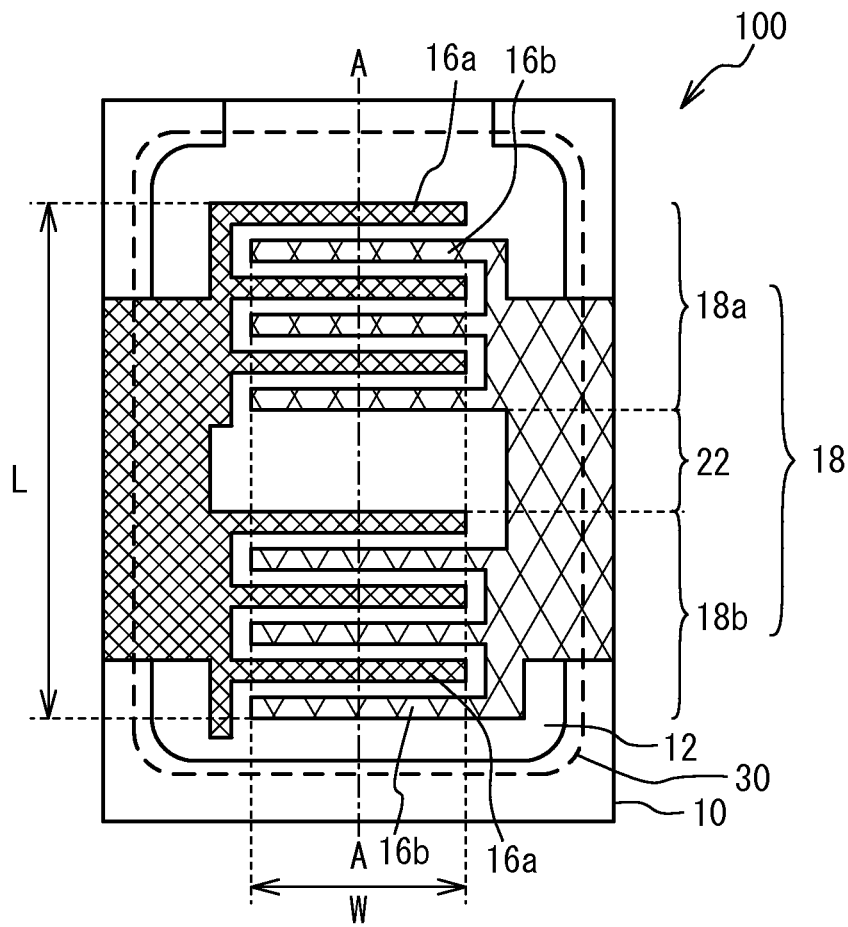
FIG. 8A is a plan view of a filter in accordance with a first embodiment.
Figure 8B:
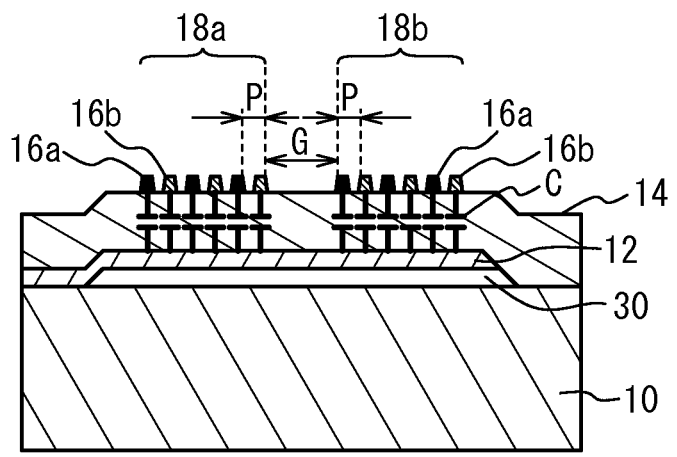
FIG. 8B is a cross-sectional view taken along line A-A in FIG. 8A.

FIG. 8A is a plan view of a filter in accordance with a first embodiment, and FIG. 8B is a cross-sectional view taken along line A-A in FIG. 8A. As illustrated in FIG. 8A and FIG. 8B, a filter 100 includes a signal electrode 18a including the electrode fingers 16a and 16b, and a signal electrode 18b including the electrode fingers 16a and 16b. The signal electrodes 18a and 18b are formed above the single air-space 30. A gap region 22 where the electrode fingers 16a and 16b are not formed is formed between the signal electrodes 18a and 18b. Other structures are the same as those of the third comparative example, and thus the description is omitted.

The substrate 10 may be a semiconductor substrate such as a silicon substrate or a GaAs substrate, or an insulating substrate such as a quartz substrate, a glass substrate, or a ceramic substrate. The ground electrode 12 and the signal electrode 18 may be made of a single-layer film of ruthenium (Ru), chrome (Cr), aluminum (Al), titanium (Ti), copper (Cu), molybdenum (Mo), tungsten (W), tantalum (Ta), platinum (Pt), rhodium (Rh), or iridium (Ir), or a multilayered film of them.

The piezoelectric film 14 may be made of an aluminum nitride (AlN) film having a main axis in the (002) direction, a zinc oxide (ZnO) film, a lead zirconate titanate (PZT) film, or a lead titanate (PbTiO$_3$) film. Additionally, when the piezoelectric film 14 is an AlN film, it may include other elements to improve the resonance characteristics or to improve the piezoelectricity. For example, the use of scandium (Sc), two elements of divalent and quadrivalent elements, or two elements of divalent and pentavalent elements as an additive element improves the piezoelectricity of the piezoelectric film 14. The divalent element is, for example, calcium (Ca), magnesium (Mg), strontium (Sr), or zinc (Zn). The quadrivalent element is, for example, Ti, zirconium (Zr), or hafnium (Hf). The pentavalent element is, for example, Ta, niobium (Nb), or vanadium (V).

The first embodiment forms the signal electrodes 18a and 18b. The signal electrodes 18a and 18b are arranged in parallel. The signal electrodes 18a and 18b are connected in parallel when viewed as an electric circuit. This structure increases the number of electrode fingers 16a (first electrode finger) and 16b (second electrode finger) facing the ground electrode 12 as illustrated in FIG. 8B, thus enabling to increase the capacitance value between the signal electrode 18 and the ground electrode 12 compared to the structure of the third comparative example even when the electrode overlap width W is reduced. Accordingly, the aspect ratio W/L of the signal electrode 18 is reduced compared to that in the third comparative example. Therefore, the concentration of stress on the piezoelectric film 14 is reduced, and the piezoelectric film 14 is prevented from being damaged.

Furthermore, the adjacent signal electrodes 18a and 18b are at a distance G from each other, the distance G being greater than the pitch P of the electrode fingers 16a and 16b. This structure allows acoustic waves emitted from the signal electrode 18a to attenuate in the gap region 22 and reach the signal electrode 18b. Thus, the characteristics of the signal electrode 18a is prevented from being affected by the acoustic waves emitted from the signal electrode 18b. As described above, the interference between the signal electrodes 18a and 18b is reduced. Therefore, the difference in characteristics is reduced between a case where a single signal electrode is provided and a case where multiple signal electrodes are provided. The input and output impedance is easily configured by multiplying the impedance of a single signal electrode by the number of the signal electrodes 18a and 18b. When the pitches vary in the electrode fingers 16a and 16b, the adjacent signal electrodes 18a and 18b are only required to be at a distance G, which is greater than the average pitch P of the electrode fingers 16a and 16b, from each other.

When high-frequency signals applied to the signal electrodes 18a and 18b have a frequency of 2 GHz, the piezoelectric film 14 has a film thickness of approximately 1 µm, the pitch P is approximately 3 µm, and the distance G is approximately 10 µm.

Figure 9A:
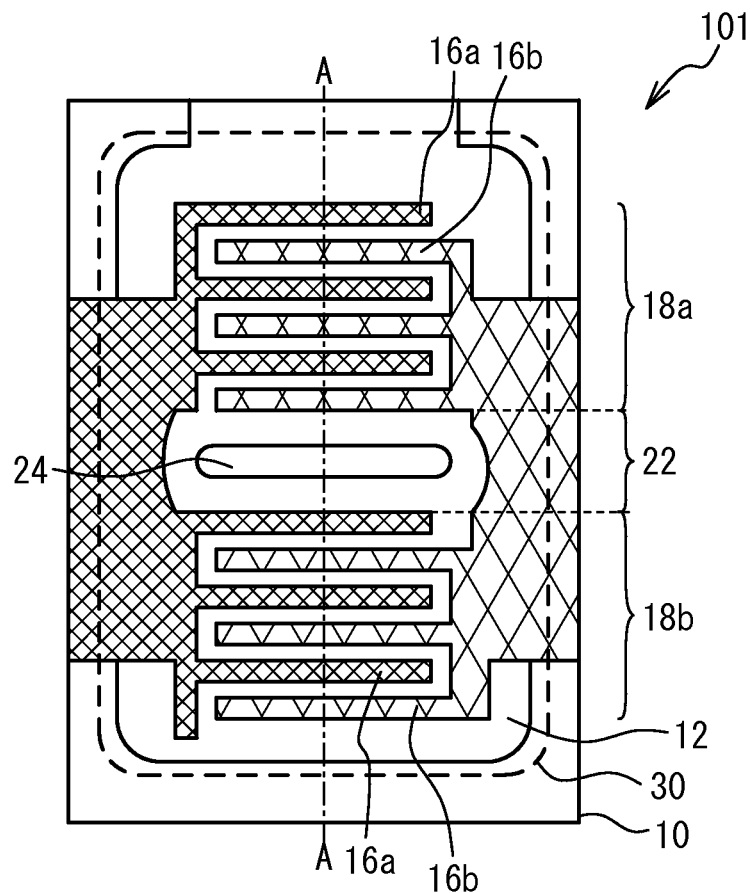
FIG. 9A is a plan view of a filter in accordance with a first variation of the first embodiment.
Figure 9B:
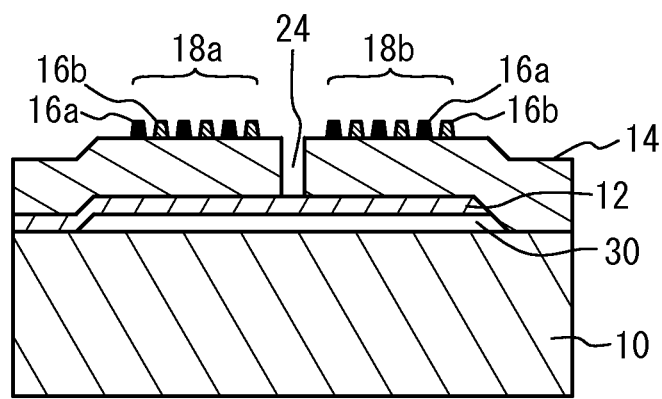
FIG. 9B is a cross-sectional view taken along line A-A in FIG. 9A.

FIG. 9A is a plan view of a filter in accordance with a first variation of the first embodiment, and FIG. 9B is a cross-sectional view taken along line A-A in FIG. 9A. As illustrated in FIG. 9A and FIG. 9B, a filter 101 includes a recessed portion 24 formed in the gap region 22 by removing the piezoelectric film 14. Other structures are the same as those of the first embodiment, and thus the description is omitted.

The first variation of the first embodiment removes at least a part of the piezoelectric film 14 between the adjacent signal electrodes 18a and 18b. The recessed portion 24 prevents acoustic waves emitted from the signal electrode 18a from reaching the signal electrode 18b. This enables to reduce the interference between the signal electrodes 18a and 18b even when the distance G of the gap region 22 is small. Thus, the size of the filter is further reduced.

The recessed portion 24 may vertically penetrate through the piezoelectric film 14, or the piezoelectric film 14 may remain under the recessed portion 24. The recessed portion 24 may have a length greater than the electrode overlap width W, or have a length less than the electrode overlap width W.

Figure 10A:
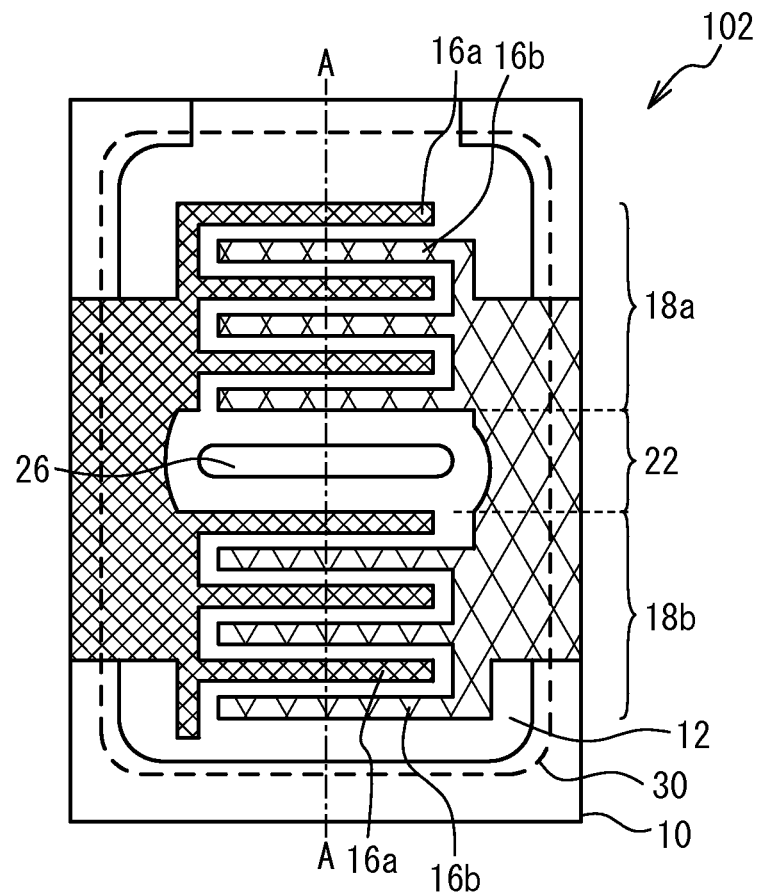
FIG. 10A is a plan view of a filter in accordance with a second variation of the first embodiment.
Figure 10B:
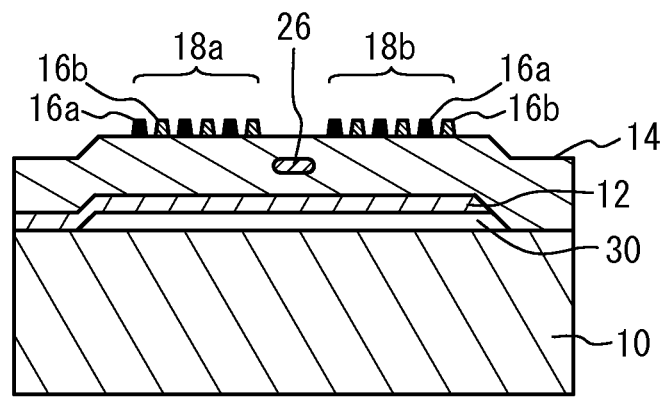
FIG. 10B is a cross-sectional view taken along line A-A in FIG. 10A.

FIG. 10A is a plan view of a filter in accordance with a second variation of the first embodiment, and FIG. 10B is a cross-sectional view taken along line A-A in FIG. 10A. As illustrated in FIG. 10A and FIG. 10B, a filter 102 includes a dielectric film 26 formed in the piezoelectric film 14 within the gap region 22. Other structures are the same as those of the first embodiment, and thus the description is omitted.

The second variation of the first embodiment forms the dielectric film 26 different from the piezoelectric film 14 in the piezoelectric film 14 between the adjacent signal electrodes 18a and 18b. The dielectric film 26 prevents acoustic waves emitted from the signal electrode 18a from reaching the signal electrode 18b. This enables to reduce the interference between the signal electrodes 18a and 18b even when the distance G of the gap region 22 is small. Thus, the size of the filter is further reduced.

The dielectric film 26 may be, for example, a silicon oxide film, a silicon nitride film, or an aluminum oxide film. The dielectric film 26 is required to be formed in at least a part of the piezoelectric film 14 in the film thickness direction. The dielectric film 26 may have a length greater than the electrode overlap width W, or may have a length less than the electrode overlap width W.

Figure 11A:
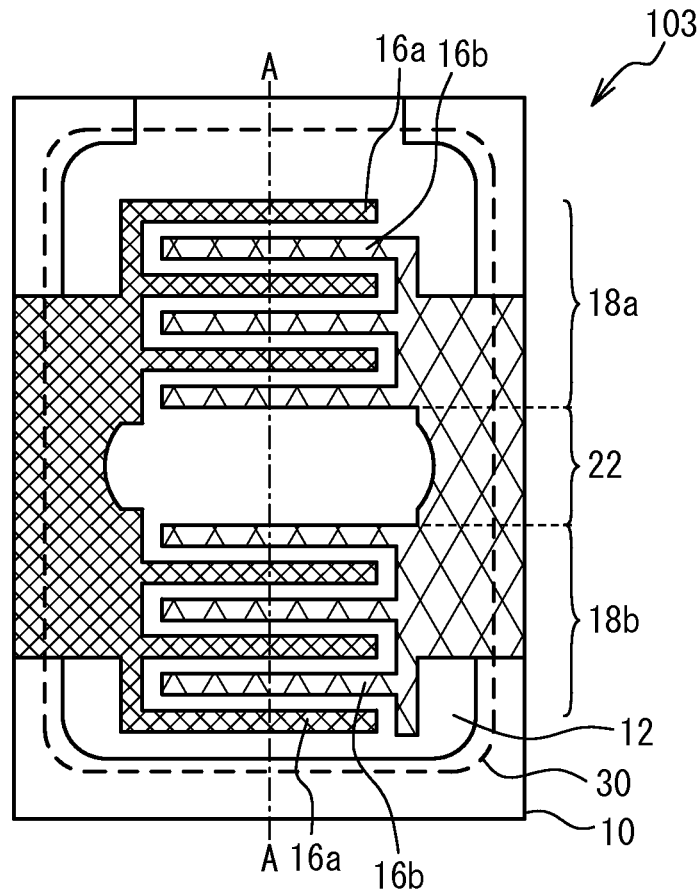
FIG. 11A is a plan view of a filter in accordance with a third variation of the first embodiment.
Figure 11B:
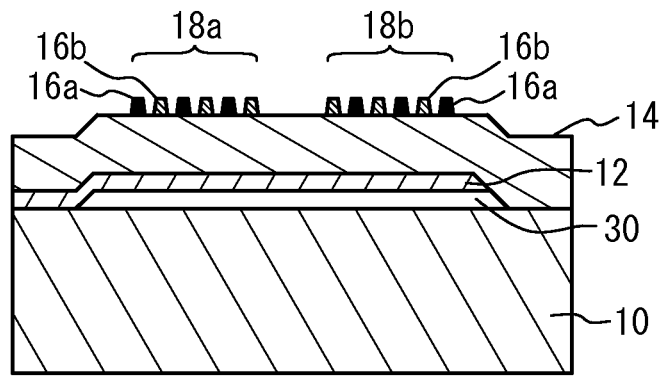
FIG. 11B is a cross-sectional view taken along line A-A in FIG. 11A.

FIG. 11A is a plan view of a filter in accordance with a third variation of the first embodiment, and FIG. 11B is a cross-sectional view taken along line A-A in FIG. 11A. As illustrated in FIG. 11A and FIG. 11B, in a filter 103, electrode fingers adjoining each other across the gap region 22 are the electrode fingers 16b.

In the second variation of the first embodiment, the electrode finger 16a of the signal electrode 18a and the electrode finger 16a of the signal electrode 18b adjoining each other have the same electric potential, or the electrode finger 16b of the signal electrode 18a and the electrode finger 16b of the signal electrode 18b adjoining each other have the same electric potential. Thus, the phase of an acoustic wave emitted from the signal electrode 18a to the signal electrode 18b is opposite to the phase of an acoustic wave emitted from the signal electrode 18b to the signal electrode 18a. This prevents the characteristics of the signal electrode 18a from being affected by the acoustic wave emitted from the signal electrode 18b. Accordingly, the interference between the signal electrodes 18a and 18b is reduced even when the distance G of the gap region 22 is small. Thus, the size of the filter is further reduced.

Figure 12A:
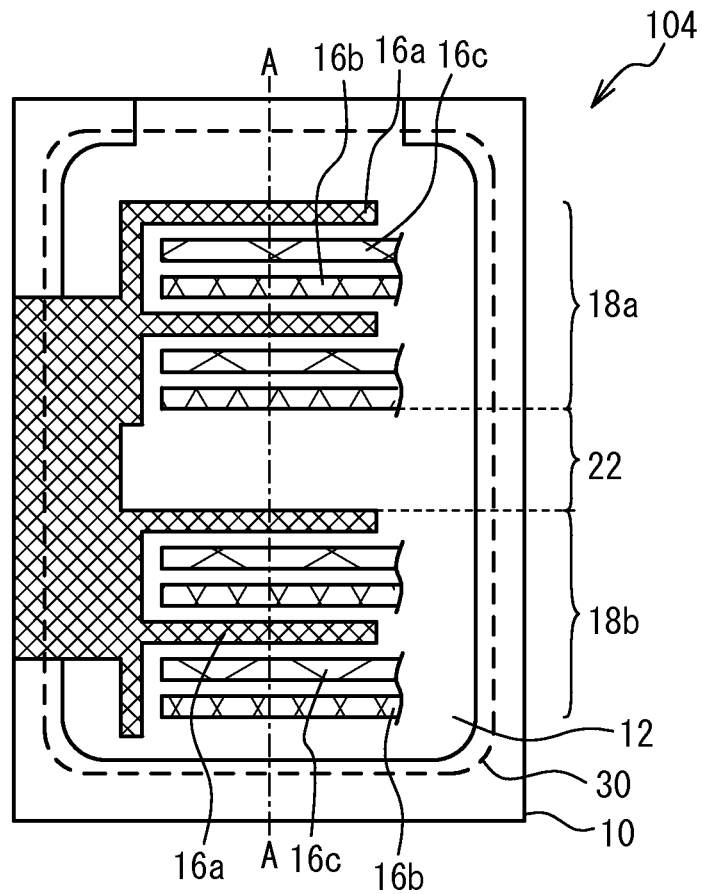
FIG. 12A is a plan view of a filter in accordance with a fourth variation of the first embodiment.
Figure 12B:
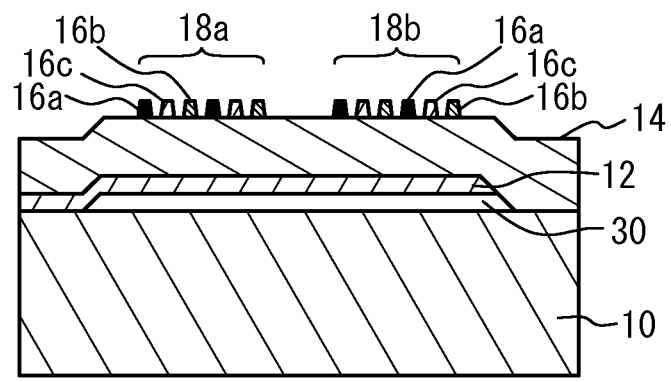
FIG. 12B is a cross-sectional view taken along line A-A in FIG. 12A.

FIG. 12A is a plan view of a filter in accordance with a fourth variation of the first embodiment, and FIG. 12B is a cross-sectional view taken along line A-A in FIG. 12A. As illustrated in FIG. 12A and FIG. 12B, in a filter 104, each of the signal electrodes 18a and 18b includes the electrode fingers 16a through 16c. The electrode fingers 16a through 16c have different electric potentials. For example, the electrode finger 16c is supplied with a ground potential.

In the fourth variation of the first embodiment, each of the signal electrodes 18a and 18b includes the electrode finger 16c having an electric potential different from those of the electrode fingers 16a and 16b. As described above, two or more signal electrodes 18a and 18b of the fourth comparative example may be connected in parallel when viewed as an electric circuit.

As described in the fourth variation of the first embodiment, two or more different electric potentials are required to be applied to the electrode fingers included in each of the signal electrodes 18a and 18b in the first embodiment and its first through third variations.

In the first embodiment and its variations, three or more signal electrodes 18a and 18b may be connected in parallel when viewed as an electric circuit. The signal electrode 18a may include one electrode finger 16a and one electrode finger 16b, or include two or more electrode fingers 16a and two or more electrode fingers 16b as described in the first comparative example. The signal electrode 18b may include one electrode finger 16a and one electrode finger 16b, or include two or more electrode fingers 16a and two or more electrode fingers 16b as described in the first comparative example.

Second Embodiment

Figure 13A:
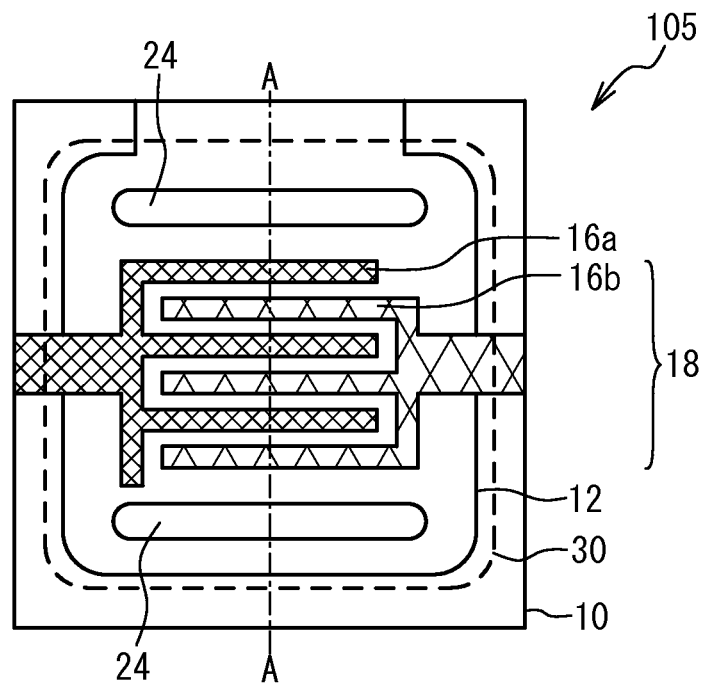
FIG. 13A is a plan view of a filter in accordance with a second embodiment.
Figure 13B:
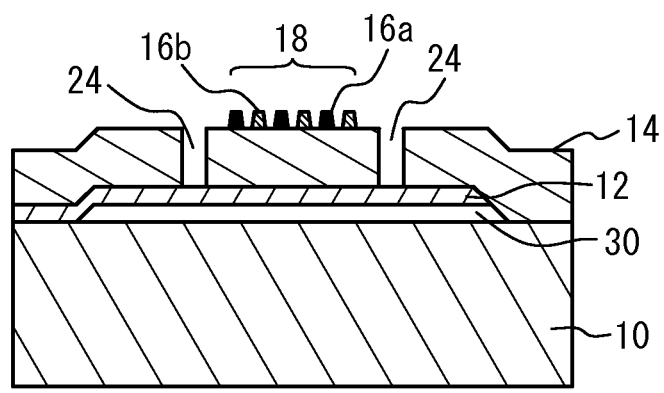
FIG. 13B is a cross-sectional view taken along line A-A in FIG. 13A.

FIG. 13A is a plan view of a filter in accordance with a second embodiment, and FIG. 13B is a cross-sectional view taken along line A-A in FIG. 13A. As illustrated in FIG. 13A and FIG. 13B, a filter 105 includes a single signal electrode 18. The recessed portions 24 are formed in the arrangement direction of the electrode fingers 16a and 16b of the signal electrode 18. The recessed portions 24 have the same structure as that of the first variation of the first embodiment. Other structures are the same as those of the first embodiment, and thus the description is omitted.

The second embodiment removes at least a part of the piezoelectric film 14 at the outside of the signal electrode 18 in the arrangement direction of the electrode fingers 16a and 16b. This structure prevents acoustic waves emitted from the signal electrode 18 from propagating outward in the lateral direction of the signal electrode 18. Thus, the interference with the signal electrode adjacent to the signal electrode 18 is reduced, for example. The recessed portion 24 is required to be located at one side of both sides of the signal electrode 18. The recessed portion 24 may be also located at the outside of the outermost signal electrode 18 in the first embodiment and its variations.

Figure 14A:
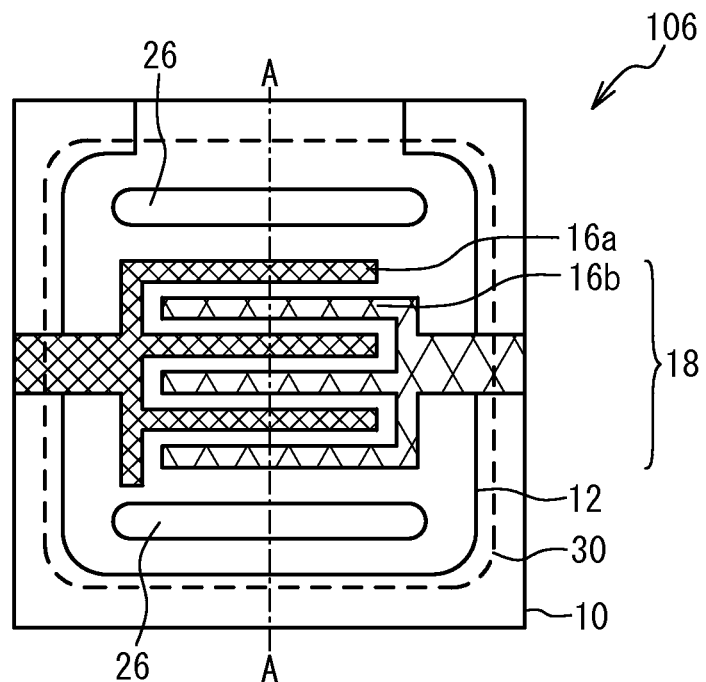
FIG. 14A is a plan view of a filter in accordance with a first variation of the second embodiment.
Figure 14B:
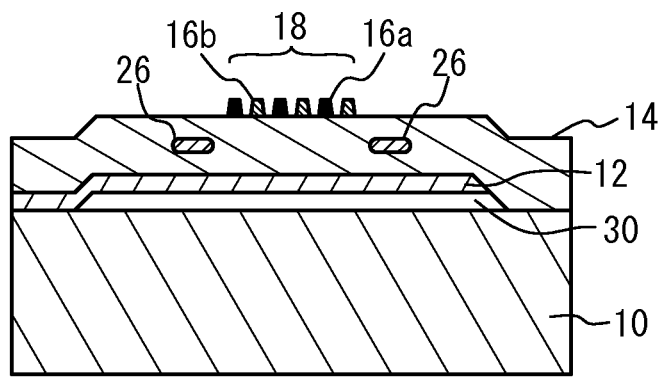
FIG. 14B is a cross-sectional view taken along line A-A in FIG. 14A.

FIG. 14A is a plan view of a filter in accordance with a first variation of the second embodiment, and FIG. 14B is a cross-sectional view taken along line A-A in FIG. 14A. As illustrated in FIG. 14A and FIG. 14B, a filter 106 includes a single signal electrode 18. The dielectric films 26 are formed in the arrangement direction of the electrode fingers 16a and 16b of the signal electrode 18. The dielectric films 26 have the same structure as that of the second variation of the first embodiment. Other structures are the same as those of the first embodiment, and thus the description is omitted.

The first variation of the second embodiment forms the dielectric films 26 different from the piezoelectric film 14 in the piezoelectric film 14 at the outside of the signal electrode 18 in the arrangement direction of the electrode fingers 16a and 16b. This structure prevents acoustic waves emitted from the signal electrode 18 from propagating outward in the lateral direction of the signal electrode 18. Thus, the interference with the signal electrode adjacent to the signal electrode 18 is reduced, for example. The dielectric film 26 is required to be located at one of both sides of the signal electrode 18. The dielectric film 26 may be formed at the outside of the outermost signal electrode 18 in the first embodiment and its variations.

Figure 15A:
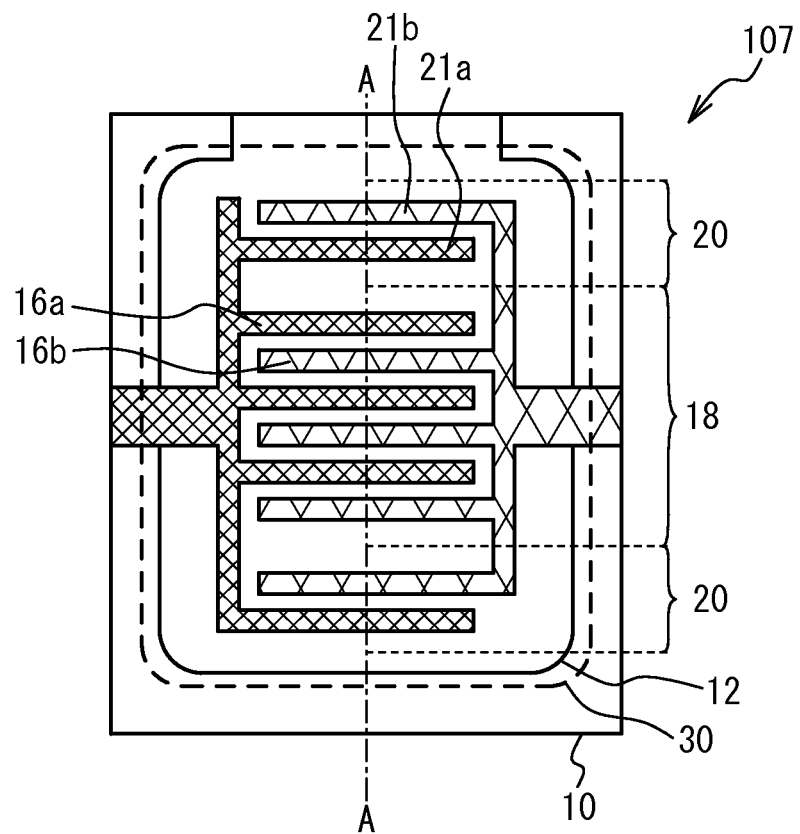
FIG. 15A is a plan view of a filter in accordance with a second variation of the second embodiment.
Figure 15B:
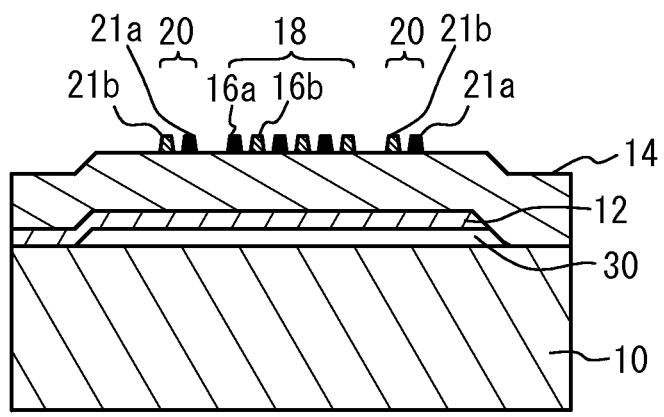
FIG. 15B is a cross-sectional view taken along line A-A in FIG. 15A.

FIG. 15A is a plan view of a filter in accordance with a second variation of the second embodiment, and FIG. 15B is a cross-sectional view taken along line A-A in FIG. 15A. As illustrated in FIG. 15A and FIG. 15B, a filter 107 includes a single signal electrode 18. Reverse-phase electrodes 20 are formed in the arrangement direction of the electrode fingers 16a and 16b of the signal electrode 18. The reverse-phase electrode 20 includes an electrode finger 21a having the same electric potential as the electrode finger 16a, and an electrode finger 21b having the same electric potential as the electrode finger 16b. The reverse-phase electrode 20 emits an acoustic wave having a phase opposite to that of an acoustic wave emitted from the signal electrode 18 in the lateral direction of the signal electrode 18. Other structures are the same as those of the first embodiment, and thus the description is omitted.

The second variation of the second embodiment provides the reverse-phase electrodes 20 at the outside of the signal electrode 18 in the arrangement direction of the electrode fingers 16a and 16b. The reverse-phase electrode 20 includes the electrode finger 21a (third electrode finger) having the same electric potential as the electrode finger 16a, and the electrode finger 21b (fourth electrode finger) having the same electric potential as the electrode finger 16b. The adjacent electrode fingers 16a and 21a have the same electric potential, or the adjacent electrode fingers 16b and 21b have the same electric potential. As described above, the electrode fingers 16a and 21a having the same electric potential are continuously located, and the electrode fingers 16b and 21b having the same electric potential are continuously located. This structure prevents acoustic waves emitted from the signal electrode 18 from compensating acoustic waves emitted from the electrode finger 21a or 21b, and prevents the acoustic wave emitted from the signal electrode 18 from propagating outward in the lateral direction of the signal electrode 18. Thus, the interference with the signal electrode adjacent to the signal electrode 18 is reduced. The distance between the adjacent electrode fingers 16a and 21a may be the same as or different from the distance between the electrode fingers 16a and 16b in the signal electrode 18. The reverse-phase electrode 20 is required to be located at one of both sides of the signal electrode 18. The reverse-phase electrode 20 may be located at the outside of the outermost signal electrode 18 in the first embodiment and the variation of the embodiment.

In the second embodiment and its variations, the electrode finger may include the electrode finger 16c having an electric potential different from those of the electrode fingers 16a and 16b as with in the fourth comparative example. As described above, two or more different electric potentials are required to be applied to the electrode fingers included in the signal electrode 18. The signal electrode 18 may include one electrode finger 16a and one electrode finger 16b, or include two or more electrode fingers 16a and two or more electrode fingers 16b as with in the first comparative example.

Third Embodiment

Figure 16A:
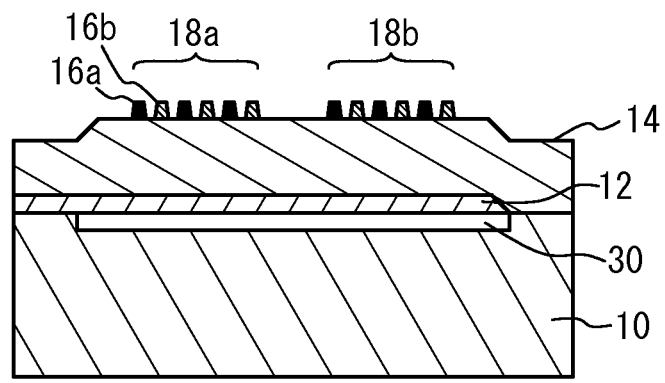
FIG. 16A and FIG. 16B are cross-sectional views of filters in accordance with a third embodiment and a first variation of the third embodiment, respectively.
Figure 16B:
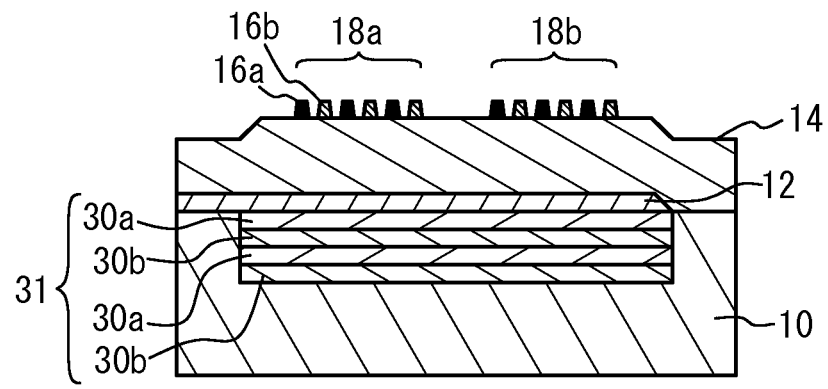

A third embodiment and its variation change the structure of the air-space. FIG. 16A and FIG. 16B are cross-sectional views of filters in accordance with the third embodiment and a first variation of the third embodiment, respectively. As illustrated in FIG. 16A, a recessed portion is formed in the upper surface of the substrate 10. The ground electrode 12 is flatly formed on the substrate 10. Thus, the air-space 30 is formed in the recessed portion of the substrate 10. The air-space 30 is formed to include the signal electrodes 18a and 18b. Other structures are the same as those of the first embodiment, and thus the description is omitted. The air-space 30 may be formed to penetrate through the substrate 10. An insulating film may be formed to make contact with the lower surface of the ground electrode 12. That is to way, the air-space 30 may be formed between the substrate 10 and the insulating film making contact with the ground electrode 12. The insulating film may be, for example, an aluminum nitride film.

As illustrated in FIG. 16B, an acoustic mirror 31 is formed under the ground electrode 12. The acoustic minor 31 is formed by alternately stacking a film 30a with a low acoustic impedance and a film 30b with a high acoustic impedance. The films 30a and 30b have film thicknesses of, for example, λ/4 (λ is the wavelength of the acoustic wave). The number of stacking layers of the films 30a and 30b are freely selected. Other structures are the same as those of the first embodiment, and thus the description is omitted.

The air-space 30 may be formed in the first and second embodiments and their variations as with in the third embodiment, or the acoustic mirror 31 may be formed instead of the air-space 30 as with in the first variation of the third embodiment. The air-space 30 and the acoustic mirror 31 act as a reflector reflecting acoustic waves propagating through the piezoelectric film 14.

In the first through third embodiments and their variations, the ground electrode 12 is formed on the lower surface of the piezoelectric film 14, and the signal electrode 18 is formed on the upper surface of the piezoelectric film 14. However, the ground electrode 12 may be formed on the upper surface of the piezoelectric film 14, and the signal electrode 18 may be formed on the lower surface of the piezoelectric film 14.

Although the embodiments of the present invention have been described in detail, it is to be understood that the various change, substitutions, and alterations could be made hereto without departing from the spirit and scope of the invention.

What is claimed is:

1. A laterally coupled multi-mode monolithic filter comprising:
    a substrate;
    a piezoelectric film formed on the substrate;
    a ground electrode formed on a first surface of the piezoelectric film; and
    signal electrodes formed on a second surface of the piezoelectric film and arranged in parallel to each other, the second surface being opposite to the first surface, each of the signal electrodes including first electrode fingers and a second electrode finger,
    wherein the first electrode fingers and the second electrode finger have different electric potentials, and
    adjacent signal electrodes of the signal electrodes are at a distance from each other, the distance being greater than a pitch of the first electrode fingers.

2. The laterally coupled multi-mode monolithic filter according to claim 1, wherein
    at least a part of the piezoelectric film is removed between the adjacent signal electrodes.

3. The laterally coupled multi-mode monolithic filter according to claim 1, further comprising:
    a dielectric film formed in the piezoelectric film between the adjacent signal electrodes and differing from the piezoelectric film.

4. The laterally coupled multi-mode monolithic filter according to claim 1, wherein
    adjacent electrode fingers, each included in a corresponding signal electrode of the adjacent signal electrodes, have a same electric potential.

5. The laterally coupled multi-mode monolithic filter according to claim 1, wherein
    a single air space reflecting an acoustic wave propagating through the piezoelectric film is formed under the ground electrode, the piezoelectric film, and the signal electrodes so that the signal electrodes are formed above the single air-space.

6. The laterally coupled multi-mode monolithic filter according to claim 1, wherein
    the signal electrode includes a fifth electrode finger having an electric potential different from an electric potential of the first electrode fingers and an electric potential of the second electrode finger.

7. The laterally coupled multi-mode monolithic filter according to claim 1, wherein
    the signal electrodes are connected in parallel when viewed as an electric circuit.

8. The laterally coupled multi-mode monolithic filter according to claim 1, wherein
    the pitch of the first electrode fingers is an average pitch.

9. A laterally coupled multi-mode monolithic filter comprising:
    a substrate;
    a piezoelectric film formed on the substrate;
    a ground electrode formed on a first surface of the piezoelectric film; and
    a signal electrode formed on a second surface of the piezoelectric film and including a first electrode finger and a second electrode finger, the second surface being opposite to the first surface, the second electrode finger having an electric potential different from an electric potential of the first electrode finger, wherein at least a part of the piezoelectric film is removed at an outside of the signal electrode in an arrangement direction of the first electrode finger and the second electrode finger and wherein a first region, in which the piezoelectric film is not removed, is located between a second region, in which the at least a part of the piezoelectric film is removed at the outside of the signal electrode, and a closest finger to the first region among the first electrode finger and the second electrode finger.

10. The laterally coupled multi-mode monolithic filter according to claim 9, wherein the signal electrode includes a fifth electrode finger having an electric potential different from an electric potential of the first electrode finger and an electric potential of the second electrode finger.

11. A laterally coupled multi-mode monolithic filter comprising:

a substrate;

a piezoelectric film formed on the substrate;

a ground electrode formed on a first surface of the piezoelectric film;

a signal electrode formed on a second surface of the piezoelectric film and including a first electrode finger and a second electrode finger, the second surface being opposite to the first surface, the second electrode finger having an electric potential different from an electric potential of the first electrode finger; and a reverse-phase electrode including a third electrode finger and a fourth electrode finger at an outside of the signal electrode in an arrangement direction of the first electrode finger and the second electrode finger, the third electrode finger having an electric potential same as an electric potential of the first electrode finger, the fourth electrode having an electric potential same as an electric potential of the second electrode finger, wherein the first electrode finger and the third electrode finger adjacent to each other have a same electric potential, or the second electrode finger and the fourth electrode finger adjacent to each other have a same electric potential.

12. The laterally coupled multi-mode monolithic filter according to claim 11, wherein the signal electrode includes a fifth electrode finger having an electric potential different from an electric potential of the first electrode finger and an electric potential of the second electrode finger.

13. A laterally coupled multi-mode monolithic filter comprising:

a substrate;

a piezoelectric film formed on the substrate;

a ground electrode formed on a first surface of the piezoelectric film;

a signal electrode formed on a second surface of the piezoelectric film and including a first electrode finger and a second electrode finger, the second surface being opposite to the first surface, the second electrode finger having an electric potential different from an electric potential of the first electrode finger; and a dielectric film formed in the piezoelectric film at an outside of the signal electrode in an arrangement direction of the first electrode finger and the second electrode finger and differing from the piezoelectric film, wherein a first region, in which the dielectric film is not formed in the piezoelectric film, is located between a second region, in which the dielectric film is formed in the piezoelectric film at the outside of the signal electrode, and a closest finger to the first region among the first electrode finger and the second electrode finger.

14. The laterally coupled multi-mode monolithic filter according to claim 13, wherein the signal electrode includes a fifth electrode finger having an electric potential different from an electric potential of the first electrode finger and an electric potential of the second electrode finger.

* * * * *